United States Patent [19]
Forlani

[11] 3,785,044
[45] Jan. 15, 1974

[54] METHOD FOR MOUNTING INTEGRATED CIRCUIT CHIPS ON INTERCONNECTION SUPPORTS

[75] Inventor: Franco Forlani, Monza, Italy

[73] Assignee: Honeywell Information Systems Italia, Caluso, Italy

[22] Filed: Nov. 2, 1971

[21] Appl. No.: 194,829

[30] Foreign Application Priority Data

Nov. 17, 1970 Italy ........................ 31828A/70

[52] U.S. Cl. ........................ 29/591, 29/589, 29/626
[51] Int. Cl. ........................ B01j 17/00
[58] Field of Search .................. 29/576 S, 578, 589, 29/577, 591

[56] References Cited

UNITED STATES PATENTS 3,195,026 7/1965 Wegner ............................ 29/576 S
3,374,537 3/1968 Doelp ................................ 29/627
3,440,027 4/1969 Hugle ............................... 29/576 S
3,544,857 12/1970 Byrne .............................. 29/576 S

*Primary Examiner*—Charles W. Lanham
*Assistant Examiner*—W. C. Tupman
*Attorney*—Fred Jacob et al.

[57] ABSTRACT

A method for obtaining the precise positioning of semiconductor chips on a ceramic support which employs an auxiliary support comprising an insulating sheet having openings provided therein and on which portions of conductors forming the beam leads for all the chips are etched from an adherent aluminum sheet. Portions of the conductors extend over the opening, and are subsequently welded to the chip and the terminal pads on the ceramic support prior to being severed from the auxiliary support.

3 Claims, 6 Drawing Figures

Franco FORLANI
INVENTOR.
By [signature]
ATTORNEY.

Franco FORLANI
INVENTOR
By [signature]
ATTORNEY

METHOD FOR MOUNTING INTEGRATED CIRCUIT CHIPS ON INTERCONNECTION SUPPORTS

The present invention relates to a method for mounting electronic integrated circuit units on the support which carries the circuits for mutual and external interconnection of said units.

BACKGROUND OF THE INVENTION

It is known in the art to assemble a number of semiconductor chips on which integrated circuits are fabricated on a single insulating support, generally of a ceramic nature, and to provide for the interconnection of said chips, and the terminals for external connection, by a set of leads deposited on said support. Thus a system of interconnected chips is obtained, which may be enclosed in a single package provided with the pins needed for the exterior connection.

The main difficulties encountered in assembling such a system of chips relates to the requirement for precisely positioning the semi-conductor chips bearing the integrated circuits, with reference to the interconnecting leads deposited on the ceramic support, and to the means for connecting the integrated unit terminals to such leads. This connection may be made by soldering very thin wires to each terminal and to the correspondent interconnection lead. This operation must be made on one terminal at a time, and is therefore very time-consuming and costly, and its results are often unreliable.

In the instance where the integrated chips are provided with beam leads, the connection may be made by welding all of the terminals, or part of them at the same time. However, serious problems and difficulties are encountered due to the mutual chemical reactivity, to the weldability and to the adhesivity to the substrate, of the different materials which are involved in the process, both on the integrated chips and on the interconnecting support.

Copending U.S. Patent Application Ser. No. 196,442, filed on Nov. 2, 1971 corresponding to Italian Patent Application 31333 A/70, filed in Italy November 5, 1970, and assigned to the same assignee as the present Application, describes a method for obtaining aluminum beam leads jutting out of the integrated chips and suitable for welding to prearranged pads on the interconnecting support. Copending U.S. Application Ser. No. 872,638 filed on Oct. 30, 1969, and now abandoned, and, corresponding to Italian Pat. No. 846.347 filed in Italy Oct. 31, 1968, and assigned to the same assignee as aforesaid, describes in addition a method for arranging said interconnecting leads on different mutually insulated layers, by the combined use of thin film conductors, and of thick film conductive leads and insulating layers. Thus, the topological capability of interconnection between chips is increased, and therefore a greater number of chips may be arranged on a single support. Correspondingly however, the requirements for precise positioning, the problems concerning simultaneous welding and reliability of the welded connections become more important and difficult to meet.

SUMMARY OF THE INVENTION

The present invention provides a method of simultaneously obtaining the precise positioning of all the chips which have to be assembled on the same ceramic support and obtaining their electrical connection, in a rapid, economical and reliable way, by means of beam leads welded at the same time. This objective is attained by the use of an auxiliary support, consisting of an insulating sheet, on which portions of conductors, comprising the beam leads for all the chips, are obtained by etching from an adherent aluminum sheet. In addition, suitable openings are provided in the insulating support, over which part of the conductors jut out. The method according to the invention comprises essentially the following steps: welding the internal ends of said jutting conductors to the terminals of the integrated chips, thus removing the chip from its container, repeating the operation for all chips; superimposing the auxiliary support provided with the chips on the ceramic support and welding the conductors on the auxiliary support to the predisposed terminal pads of the ceramic support leads; subsequently cutting said conductors externally of said pads, and removing the auxiliary support, leaving in place the chips which are, as a result, securely welded to the pads of the interconnecting leads of the ceramic support.

It is thus possible to automate the whole operation, to effectuate all welding at one time, and also, in an intermediate step of the process, to conduct static and dynamic tests on the integrated circuits of the chips, thus obtaining substantial advantages in economy, reliability, and time involved.

BRIEF DESCRIPTION OF THE DRAWINGS

A preferred embodiment of the invention is described with reference to the attached drawings, wherein:

With reference to FIG. 1, on a ceramic support 1 a network of leads is deposited in two layers, according to the technique described in U. S. Patent Application Ser. No. 872,638, filed on Oct. 30, 1969, and now abandoned, and corresponding to the Italian patent 846.347. This technique which permits the combined use of thin layers electrolytically accrued, and of thick layers deposited by serigraphic process is particularly convenient, but it is not essential for the application of the process according to the invention. At the points where the crossing leads must be mutually insulated, the insulation is obtained, according to the aforesaid patent, by the interposition of insulated layers whose contour is indicated by the reference numeral 2, which are deposited by serigraphic process. The interconnecting leads leave the spaces 3, where the integrated circuit chips must be located, free; their terminals required to be connected, by means of beam leads, to the predisposed pads 5 of the interconnection circuit. The interconnection circuit also comprises pads 6 for connection to the exterior.

Figure 1:
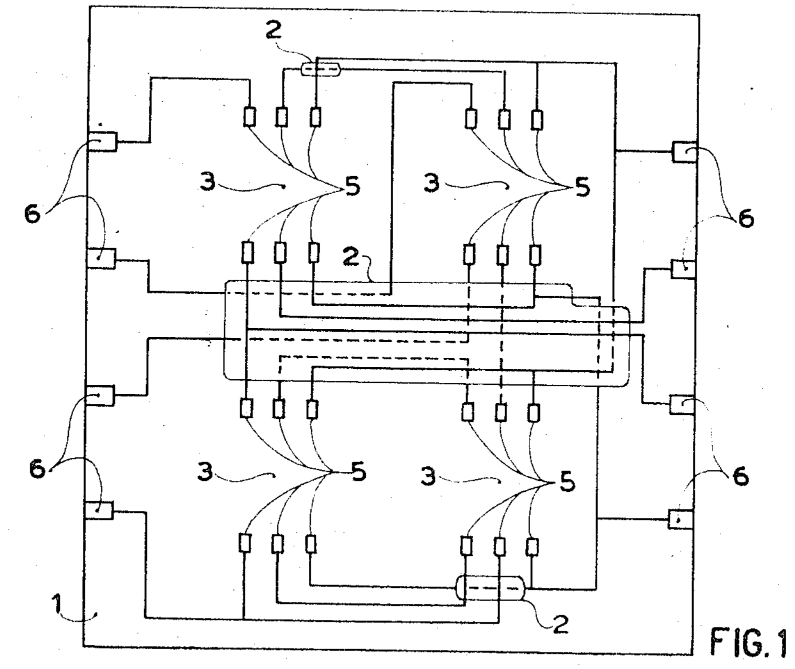
FIG. 1 is a schematic diagram of a ceramic support provided with interconnecting leads, arranged for receiving four integrated chips.
Figure 2:
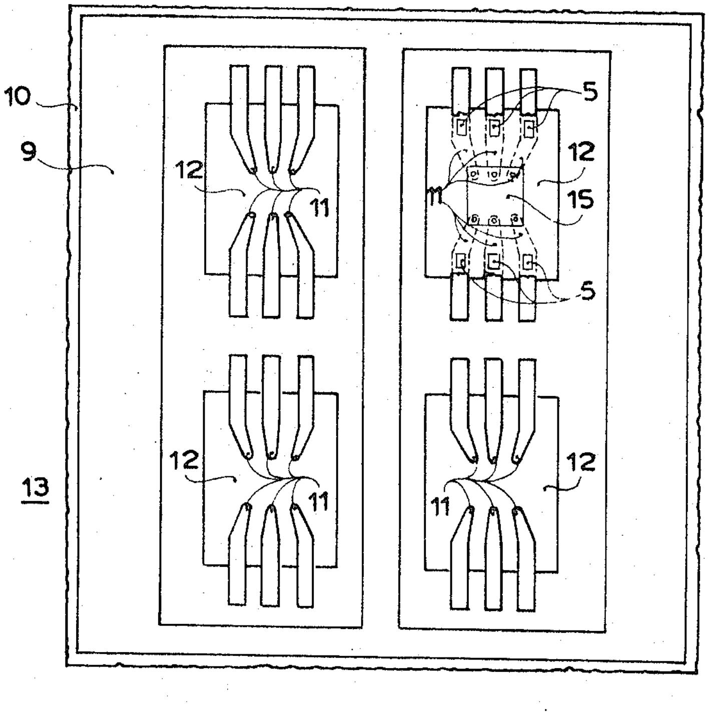
FIG. 2 shows the auxiliary support according to the invention.

As shown by FIG. 2, according to the invention, an auxiliary support indicated as a whole by reference numeral 13, is provided, preferably by the process described in the Italian Patent application 31333 A/70, and the corresponding copending U.S. Application Ser. No. 196,442, filed on Nov. 2, 1971. This auxiliary support 13 comprises a sheet 10 of insulating material, which, when such process is employed, is a sheet of photosensitive insulating material, marketed under the trade name Riston. A thin foil of aluminum is made to adhere to the upper face of such sheet and the conductors 11 are obtained from this foil, by photoetching, in a known manner. In addition, the openings 12 are made in the locations corresponding to the spaces 3 left free on the support (FIG. 1), using the photosensitive properties of the Riston. These openings 12 are of such size as to be able to contain the pads 5 with a proper external margin. The conductors 11 jut out partially into these openings 12. In the right upper corner of FIG. 2 the shape of the conductors 11 is partially represented by dashed lines, in order to show the spatial relationship with the pads 5 and the final position which will be assumed by the integrated circuit chip. It may be seen that the internal ends of the connecting conductors 11 coincide in position with the terminals located on the edges of the chip 15, and that their middle parts are superimposed on the pads 5 on the ceramic support.

The external "tails" of conductors 11 adhere to the insulating sheet 10 by a sufficient length to ensure that the conductors are firmly attached thereto and cannot change their position. The rigidity of the auxiliary support 13 is increased by a frame 9 of aluminum obtained from the original foil, which surrounds the openings or a group thereof, the conductors 11 being insulated mutually, and from the frame.

Figure 3:
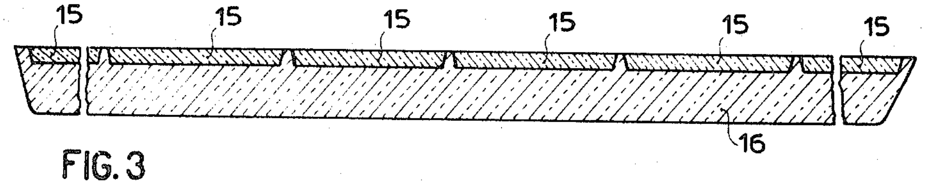
FIG. 3 is a schematic sectional view of a known device for holding the integrated chips after scribing and before assembling.

It is known that single chips, each forming an integrated circuit unit, are produced in considerable quantity from a single conductor wafer on whose surface the active and passive components, the insulating layers, the interconnection leads and the pads are fabricated with different processes of epitaxial growth, diffusion, deposition, and so on. Each wafer comprises several tens of such chips, usually all the same shape and bearing the same integrated circuitry. After fabrication, the single chips are mutually separated by scribing through chemical, electronic or mechanical processes, but remain in place. In a subsequent step, they are dipped, on their lower part, in a fluid compound which subsequently solidifies without adhering to them. Thus they are maintained in mutual unchanged position, and each chip may be individually removed. FIG. 3 is a sectional view showing a number of chips 15 maintained in position by the solidified compound 16, forming a sort of container.

Figure 4:
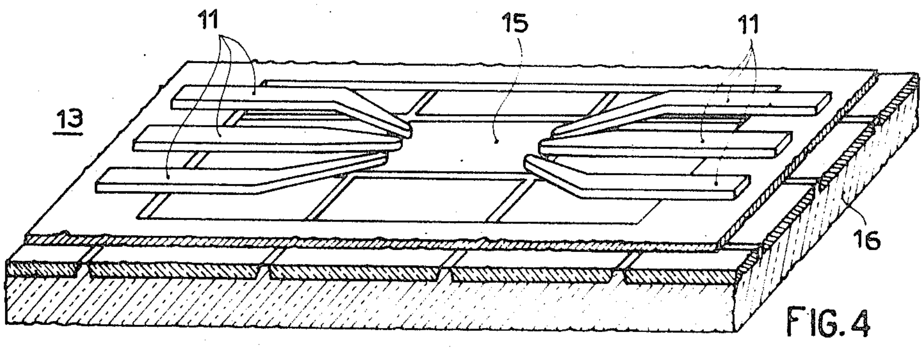
FIGS. 4, 5 and 6 show three subsequent steps for positioning and welding one chip, and removing the auxiliary support, according to the invention.

According to the invention, and as shown in FIG. 4, the auxiliary support 13 is placed on the container 16 in such a way, that the internal ends of the conductors 11 are precisely superimposed on the chip terminals. The exact congruency of the positions of these ends and of the terminals, may be easily obtained if the mask used for depositing the conductors and terminals on the chip 15, or part of it, is used also for determining the shape and position of the internal ends of the conductors 11. To obtain the exact superposition, a jig may be used, provided with a manual control permitting movement of the chip container with respect to the auxiliary support, or vice versa, for instance by micrometric screws, with accuracy and graduality. The same result may be obtained by mechanical devices for automatic positioning, numerically controlled by a suitable program.

When the conductors 11 are put in exact position with respect to the terminals of the chip 15, their ends are welded, at the same time to the corresponding terminals, by ultrasonic welding, or by thermocompression, or other suitable processes. In the frequent case where the chip terminals are made of aluminum, ultrasonic welding is conveniently used. In any case, the welding may take place at the same time for all the conductors and all the terminals of a chip.

The welded chip 15 is integral with conductors 11, so that by lifting the auxiliary support 13, the chip is removed from the container 16.

This operation is repeated as many times as there are chips 15 to be assembled on the ceramic support 1, not only when the chips are to be taken from a single container 16, but also when they are furnished by different containers. The flexibility of the Riston on the portions interposed between chips 15 permits the welding of a chip even if adjacent chips are already in place. At the end of this series of operations, the auxiliary support 13 will carry in each of its openings, the corresponding integrated circuit chip 15, welded to the internal ends of the conductor 11.

Figure 5:
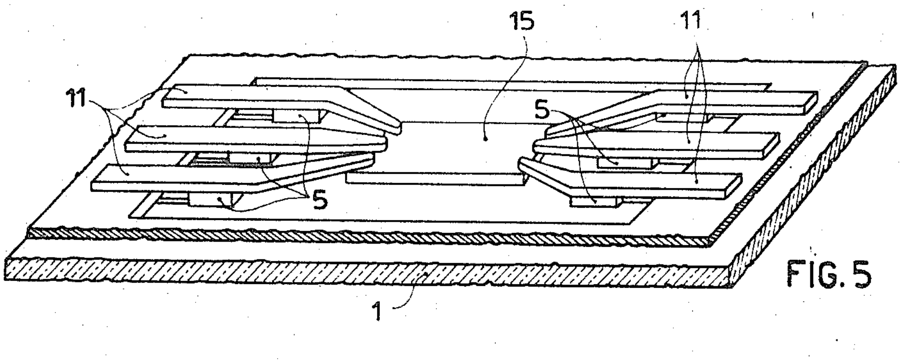
Figure 6:
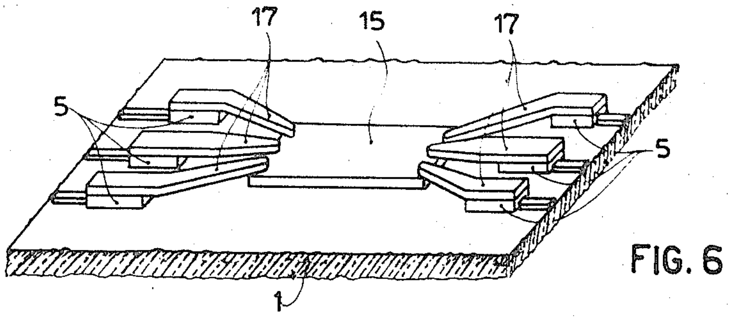

The whole auxiliary support 13 and the attached chips are now laid over the ceramic support 1, and so positioned, that as shown in FIG. 5 for one of said openings, the pads 5 located on the ceramic support are in contact with the middle parts of the conductors 11. In this instance also the precision of the coincidence between pads 5 and conductors 11 may be obtained by suitably using the mask, employed for depositing the pads on the support, for determining the shape and position of conductors 11. In FIG. 11 it has been assumed, for simplicity, that the thickness of the pads 5 is the same as the thickness of the chip 15, and that therefore their upper surfaces are at the same level. This condition may be easily satisfied by the process described in the aforementioned copending U.S. Application Ser. No. 872,638 filed on Oct. 30, 1969, and now abandoned, which provides for electrolytical growth of the conductors deposited on the ceramic support, which therefore, allows the height of the pads to increase up to the required level. However, it is not necessary that this condition be strictly satisfied, because the height difference is on the order of few microns, and the distance between terminals of the chips and pads of the support is of the order of millimeters.

Alternatively, openings or cavities may be provided in the ceramic support, in which the chip is to be contained, in order that its upper surface be at the required level.

Thus, the multiple and simultaneous welding of the conductors 11 to the underlying pads may be carried out; either for all conductors or for suitable groups of them.

Usually such pads are made of gold, and welding them to aluminum conductors, by known methods, does not prove difficult.

Subsequently, the conductors 11 are sheared immediately adjacent to the pads 5 by a punching device on the side external to the chips, and the auxiliary support 13 may be removed, leaving in place the chip 15 connected, through the resulting beam leads 17, to the pads 5.

Thus, in a very exact and reliable way, and by a series of operations which may be easily mechanized and automatized, the method according to the invention permits the mechanical assembly and the electrical connection of the integrated circuit chips to the ceramic support bearing the connection leads.

In the example described, for reasons of simplicity and clarity, the number of the chips to be assembled is limited to four, but it is self-evident that the described method is more advantageous, as the number of chips to be assembled increases. Practically this number may be of several tens, or also of the order of hundreds. It is therefore evident that such methods allow the assembly of very complex circuits summing up to a great number of individual components in compact units, having high reliability, thus obtaining a rate of yield greater than that which could be obtained if the whole circuit had to be fabricated as an integrated circuit on a single semiconductor support.

It may be noted that, after welding the internal ends of the beam leads to the terminals of the integrated circuits, the same may be submitted to functional tests, as the external ends of the conductors 11 are accessible, mutually insulated and connected to the terminals. They may easily be reached by the probes of testing devices because their dimensions and mutual spacing are much greater than those of the integrated circuits terminals.

The preceding description indicates, as a preferred process for obtaining the auxiliary support of FIG. 2, that process using the insulating and photosensitive material called Riston, and described in the copending U.S. Patent application Ser. No. 196,442, filed on November 2, 1971, and corresponding to Italian application No. 31333 A/70. However, this process is not the only one suitable for preparing such support. For instance, the openings 12 may be obtained by punching out a sheet of non-photosensitive insulating material.

Subsequently, an aluminum foil is made to adhere to the sheet, and from it the conductors 11, and the frame 9 are obtained by photoetching: afterwards, the process may continue as described. It is evident that in this case particular care must be taken to insure that the leads 11 are perfectly centered with respect to the openings.

What is claimed is:

1. A method for assembling a plurality of chips onto an insulating support member, wherein each chip is provided with at least one connector terminal and the insulating support member is provided with conductors and pads, said method comprising the use of an auxiliary support member consisting of an insulating sheet provided with openings for individually housing each one of said chips, and the use of a plurality of conductor members adhering to said insulating sheet and protruding into said openings, said process comprising the following steps:

welding the terminals of at least one chip to the internal ends of said conductor members on said auxiliary support, repeating the operation as many times as there are chips to be assembled, so as to obtain an auxiliary support which is integral with all chips located in the corresponding openings, superimposing said auxiliary support with said chips onto said insulating support in such a way, that said pads on said insulating support are in register with the middle portions of said conductor members adhering to said insulating sheet, welding said pads to said middle portions of said conductor members, and shearing said conductor members externally to said pads for obtaining, after removing said auxiliary support, said chips rigidly fixed to said pads and electrically connected thereto by the remaining portion of said conductor members.

2. The method of claim 1, whereby the conductor members provided on said auxiliary support are mutually insulated.

3. A method of assembling a plurality of semiconductor chips on a ceramic support having predisposed terminal pads, comprising the steps of;

providing an auxiliary support of insulating material having an opening provided therein for containing a chip to be assembled and a plurality of conductors extending into said openings, positioning a chip in the opening and welding the opening conductors to the terminals on the chip, positioning the auxiliary support on the ceramic support with the conductors disposed adjacent the terminal pads and welding the conductors to the pads, shearing the conductors external to the pads, and removing the auxiliary support, leaving the chip rigidly fixed to, and electrically connected to the pads by the remaining portion of the conductors.

* * * * *